United States Patent [19]

Ohgami et al.

[11] Patent Number: 5,764,477

[45] Date of Patent: Jun. 9, 1998

[54] PORTABLE APPARATUS HAVING PACK RECEPTACLE DETACHABLY CONTAINING PACK DEVICE AND SLIDER PARTIALLY LIFTING THE PACK DEVICE FROM THE PACK RECEPTACLE WHEN SLID FROM A LOCK POSITION TO AN UNLOCK POSITION

[75] Inventors: Keizo Ohgami; Masashi Mikami; Kenichi Ishikawa; Takayuki Arisaka; Yasuyuki Suzuki, all of Tokyo, Japan

[73] Assignee: Kabushiki Kaisha Toshiba, Kanagawa-ken, Japan

[21] Appl. No.: 834,062

[22] Filed: Apr. 10, 1997

[30] Foreign Application Priority Data

Apr. 30, 1996 [JP] Japan .................. 8-109507

[51] Int. Cl.$^6$ .............. G06F 1/16; H05K 7/14; E05C 1/10
[52] U.S. Cl. .............. 361/683; 361/740; 292/163
[58] Field of Search .............. 364/708.1; 361/683–686, 361/740; 292/175, 163, 164, 169; 429/96–100

[56] References Cited

U.S. PATENT DOCUMENTS

| | | | |
|---|---|---|---|
| 4,146,682 | 3/1979 | Nakao | 292/175 X |
| 5,130,892 | 7/1992 | Satou | 292/175 X |
| 5,224,018 | 6/1993 | Kobayashi | 361/685 |
| 5,576,929 | 11/1996 | Uchiyama et al. | 292/175 X |

Primary Examiner—Michael W. Phillips
Attorney, Agent, or Firm—Limbach & Limbach, LLP

[57] ABSTRACT

A portable apparatus comprises a housing having an opening portion, a pack receptacle formed in the housing, and a battery pack detachably contained in the pack receptacle through the opening portion. The pack receptacle has a slider for maintaining the battery pack at the pack receptacle. The slider is movable between a lock position and a lock releasing position, and maintained at the lock position through a spring. The slider has an insertion port, an engaging portion, a first cam portion, and a second cam portion. The insertion port is formed such that a convex portion of the battery pack is detachably inserted therethrough to be continuous to the opening portion. The engaging portion is formed to be engaged with the convex portion when the slider is moved to the lock position. The first cam portion connects the engaging portion to the insertion port, and slidably comes in contact with the convex portion when said slider is moved to the lock releasing position from the lock position, thereby pressing the convex portion to the insertion port thereby partially lifting the battery pack form the pack receptacle. The second cam portion is formed at a portion continuous to the insertion port, and the second cam portion slidably comes in contact with the convex portion when the pack device is inserted to the pack receptacle, thereby moving the slider to the lock releasing position from the lock position.

17 Claims, 13 Drawing Sheets

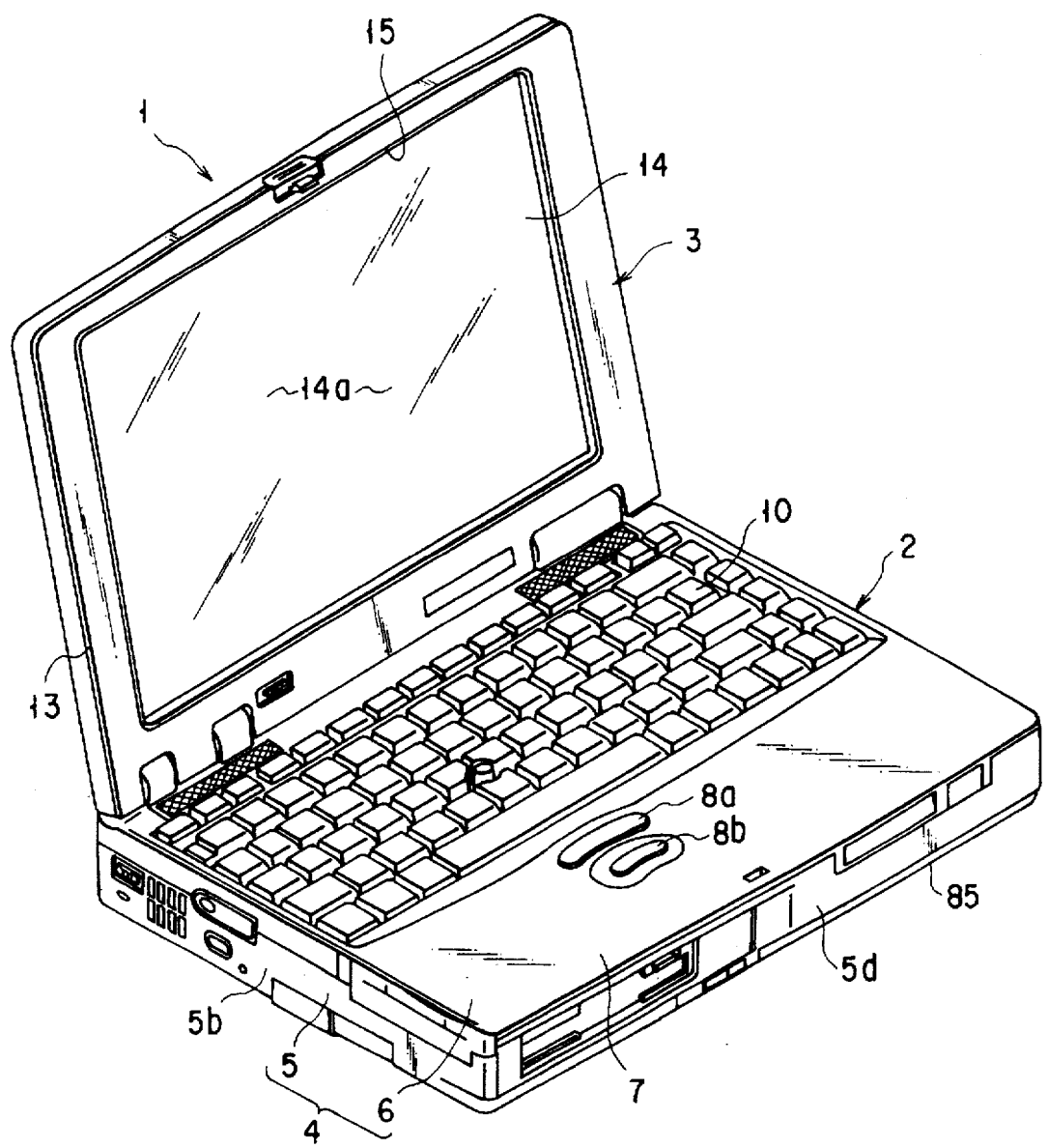
F I G. 1

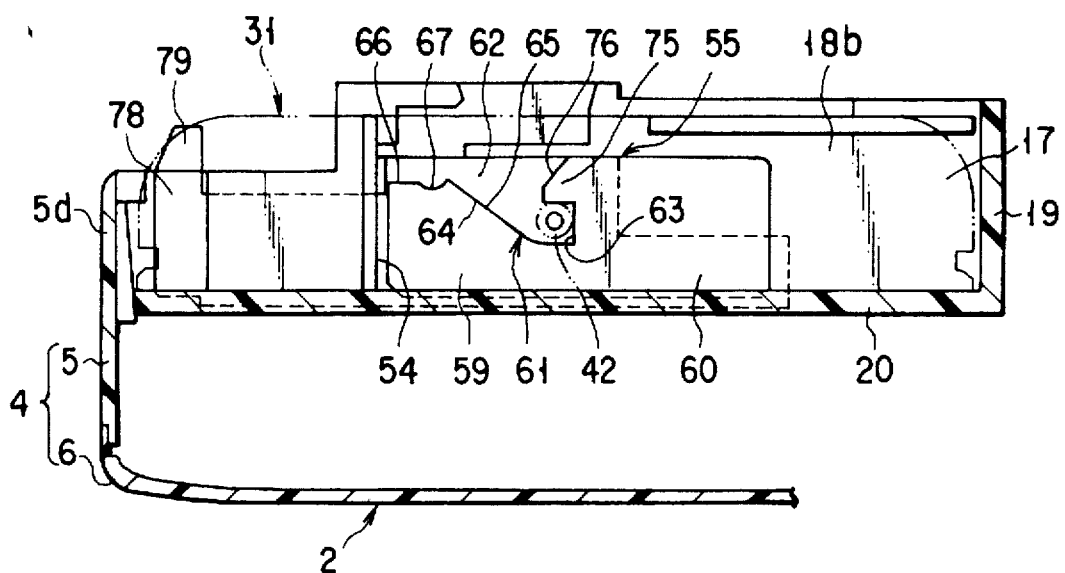
F I G. 11A
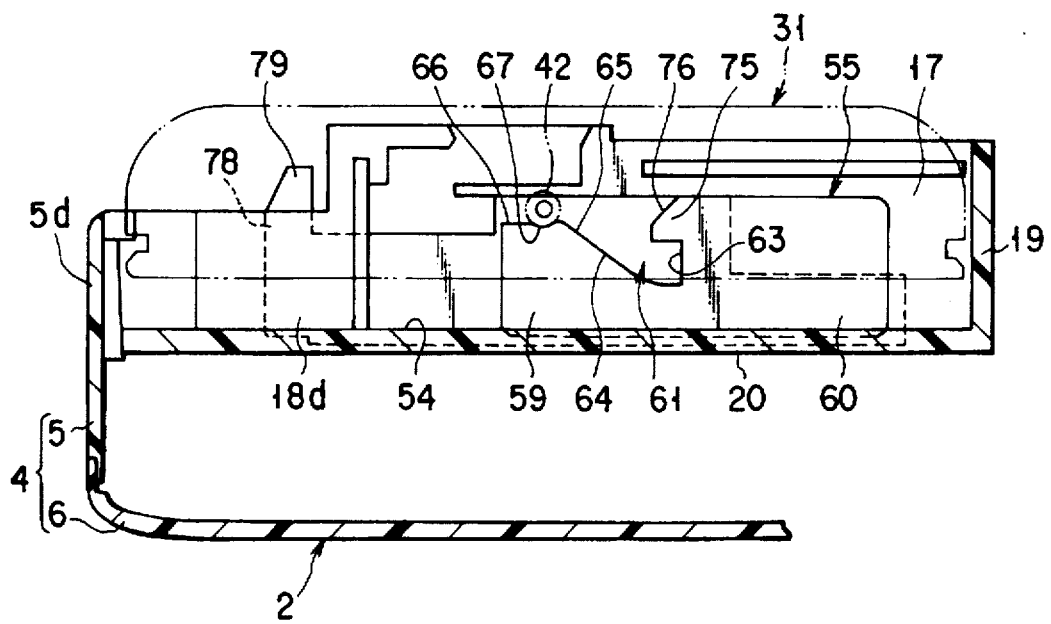
F I G. 11B

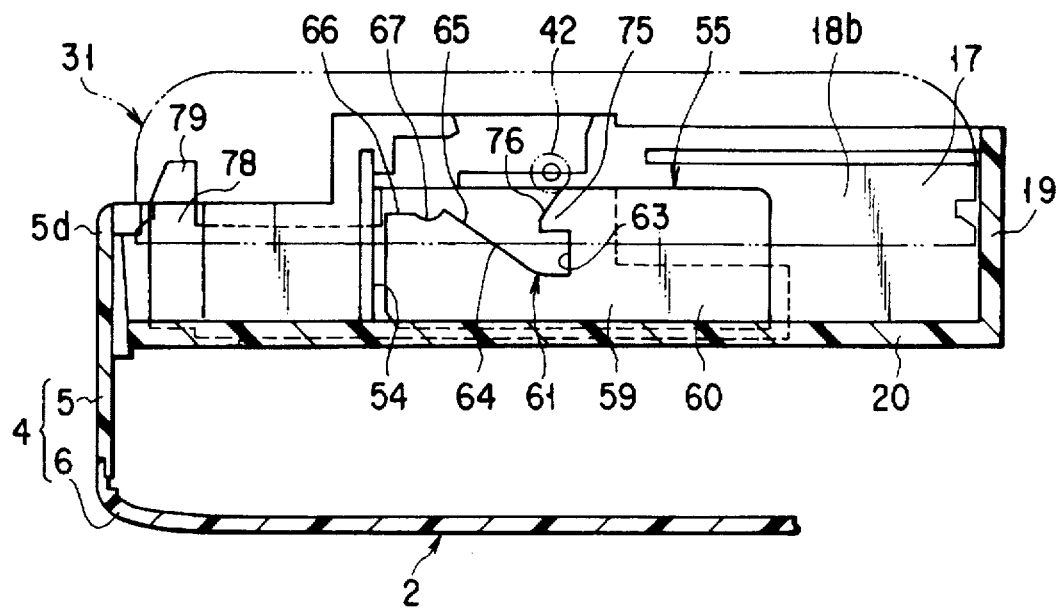
F I G. 12
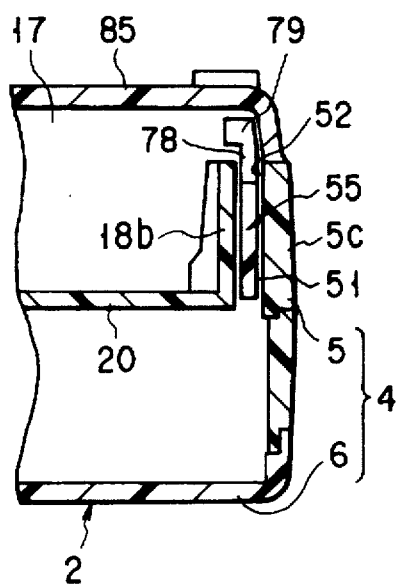
F I G. 13

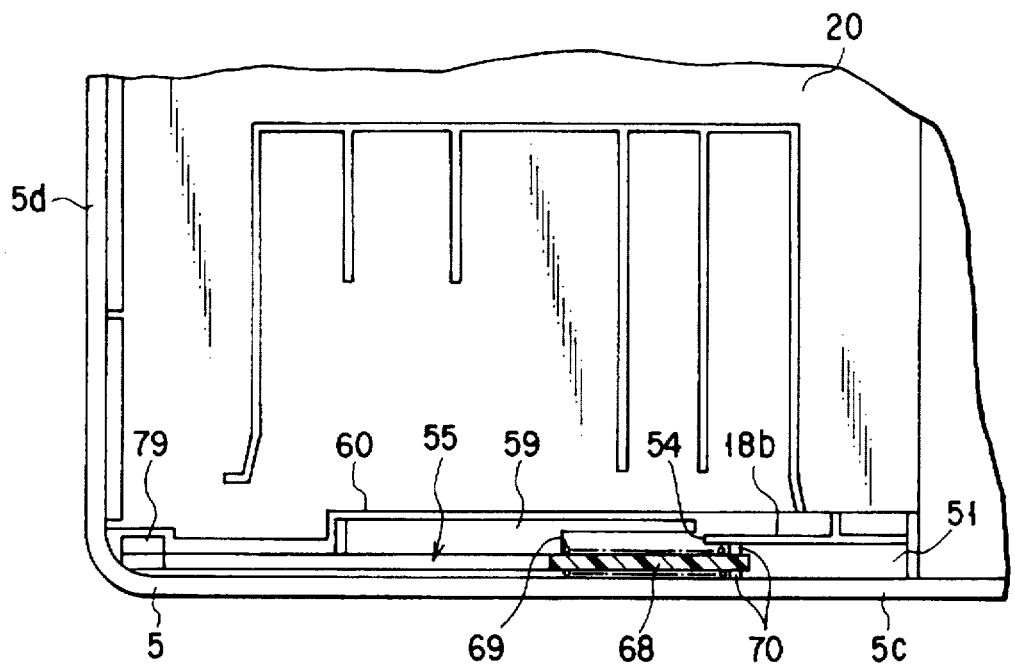
F I G. 15A
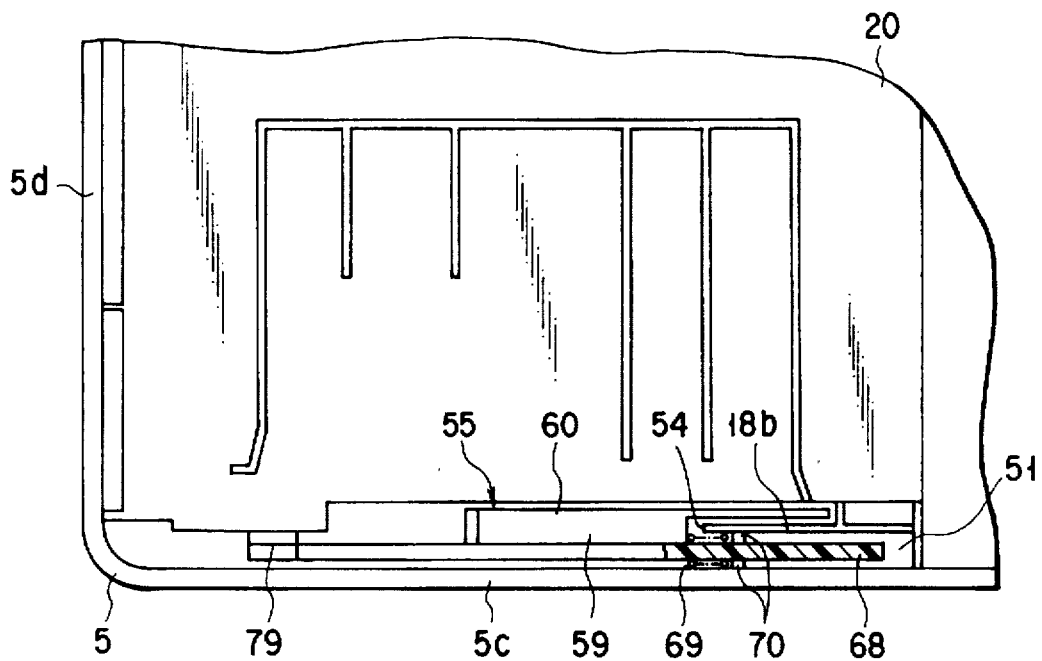
F I G. 15B

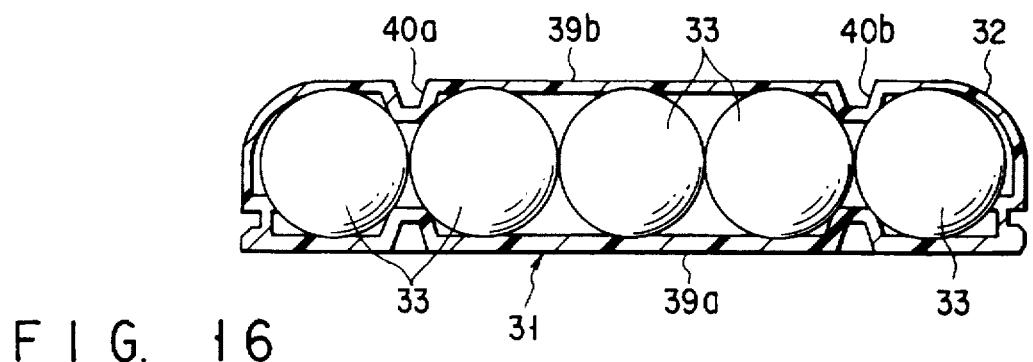
F I G. 16
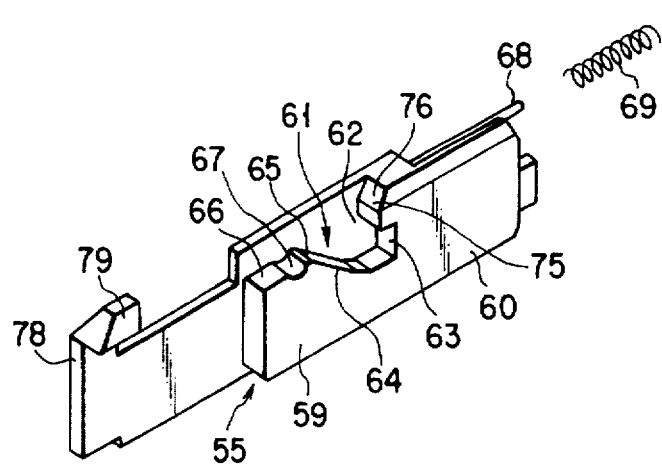
F I G. 17
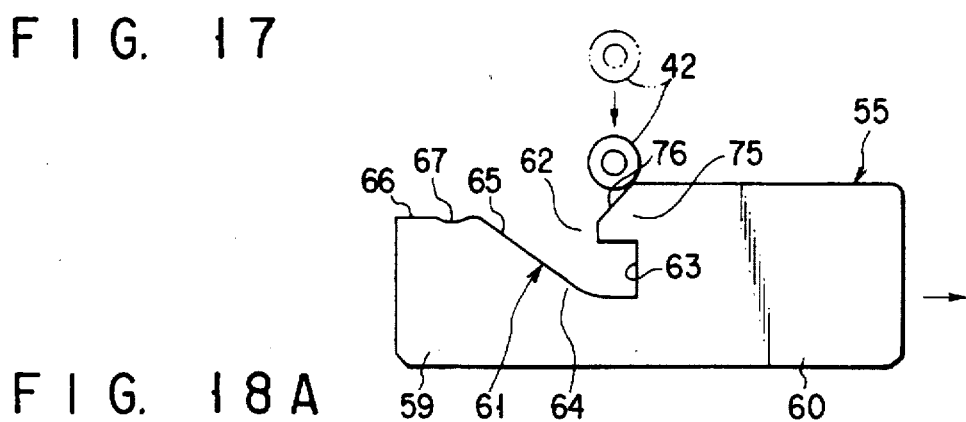
F I G. 18A
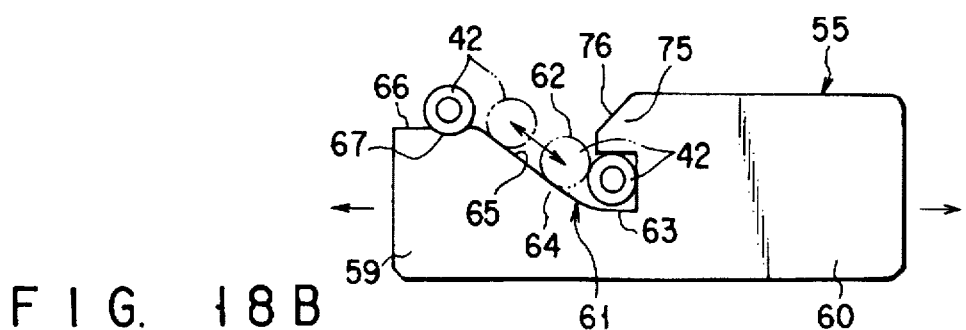
F I G. 18B

PORTABLE APPARATUS HAVING PACK RECEPTACLE DETACHABLY CONTAINING PACK DEVICE AND SLIDER PARTIALLY LIFTING THE PACK DEVICE FROM THE PACK RECEPTACLE WHEN SLID FROM A LOCK POSITION TO AN UNLOCK POSITION

BACKGROUND OF THE INVENTION

The present invention relates to a portable apparatus such as a portable computer having a box-shaped housing, and particularly to a structure for containing a pack device such as a battery pack, a hard disk drive device, or a CD-ROM drive device in the housing.

Recently, there have been provided various kinds of book-typed portable computers, which can be easily carried out, which have a high function. This kind of the computer comprises a box-shaped housing having a keyboard and a display unit supported by the housing. In the housing, various kinds of functioning parts such as a circuit board, and a hard disk drive device (HDD) are contained.

This kind of the computer has a battery pack as a power supply for driving source since such a computer is frequently used at a location where no commercial power supply is obtained. The battery pack is detachably contained in a battery receptacle, which is formed in the housing. The conventional battery receptacle has an opening portion opened to the bottom surface of the housing. The battery pack is attached/detached to/from the battery receptacle through the opening portion.

The housing of the computer has a lock lever for locking the battery pack to the battery receptacle. The lock lever is supported by the housing to be movable between a lock position where the lock lever is engaged on the battery pack and a lock releasing position where the lock lever is detached from the battery pack. The lock lever is manually operated by an operator.

The lock lever of the conventional computer has only the function of locking the battery pack to the battery receptacle and releasing the lock. Due to this, to detach the battery pack from the battery receptacle, the following complicated operation is needed.

Specifically, in a state that the lock lever is moved from the lock position to the lock releasing position, the heavy and large battery pack is pulled from the battery receptacle by putting the operator's fingers on the battery pack.

In this case, in the apparatus in which the lock lever is always pressed to the lock position through the spring, if the operator's hand is released from the lock lever moved to the lock releasing position, the lock lever is returned to the lock position. Due to this, in order to detach the battery pack from the battery receptacle, while the lock lever is maintained at the lock releasing position by one hand, the battery pack is pulled from the battery receptacle by the other hand. As a result, the operator must use both hands to detach the battery pack, and much time is required.

Moreover, in the computer in which the lock lever can be maintained at the lock position and the lock releasing position, respectively, the following two different operations must be carried out.

Specifically, after the lock lever is moved from the lock position to the lock releasing position, the battery pack is pulled out of the battery receptacle. Due to this, it takes much time to take up the battery pack. Moreover, since the lock lever is not automatically returned to the lock position, the lock lever must be moved to the lock position from the lock releasing position after the battery pack is attached to the battery receptacle. If such a lock lever operation is ignored, there is possibility that the battery pack will be detached from the battery receptacle.

BRIEF SUMMARY OF THE INVENTION

An object of the present invention is to provide a portable apparatus, which can easily insert or eject a pack device to/from a pack receptacle, and which can surely prevent the pack device from being unexpectedly detached.

According to the present invention, there is provided a portable apparatus comprising:

a housing having a bottom wall;

a pack receptacle formed in said housing, said pack receptacle having an opening portion formed on said bottom wall, a first end section having a first connector, and a second end section facing to the first end section, and said first connector being continuous to said opening portion; and a pack device contained in said pack receptacle to be detachable through said opening portion, said pack device having a first end portion, a second end portion positioned to be opposite to the first end portion, and said first end portion having a second connector contacting said first connector, wherein said pack device has a convex portion on said second end portion, said pack receptacle has lock means for maintaining said pack device at said pack receptacle on said second end section, said lock means has a slider movable between a lock position and a lock releasing position and maintained at said lock position through spring means, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position. When the slider is moved form the lock releasing portion, the pack device is partially lifted from the pack receptacle.

Also, according to the present invention, there is provided a portable apparatus comprising:

a housing having an opening portion;

a pack receptacle formed in said housing, said pack receptacle having a first end section on which a first connector is provided, and a second end section facing to the first end section, so as to be continuous to said opening portion; and a pack device detachably contained in said pack receptacle through said opening portion, and said pack device has a first end portion and a second end portion positioned to be opposite to said first end portion, and said first end portion has a second connector contacting said first connector;

wherein said pack device has a convex portion on said second end portion, said pack receptacle has lock means for maintaining said pack device at said pack receptacle on said second end section, said lock means has a slider movable between a lock position and a lock releasing position and maintained at said lock position through spring means, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position. When the slider is moved form the lock releasing portion, the pack device is partially lifted from the pack receptacle.

According to the above-mentioned structure, to detach the pack device from the pack receptacle, the slider is moved to the lock releasing position from the lock position against spring force. Thereby, the convex portion of the pack device is detached from the engaging portion of the slider to be guided to the first cam portion. Since the first cam portion presses the convex portion to the insertion port when the slider is moved from the lock position to the lock releasing position, the pack device rotates in a state that the contact portion between the first and second connectors are used as a fulcrum. By this rotation, the second end portion of the pack device having the convex portion is projected to the outside of the housing through the opening portion. Therefore, the second end portion of the pack device can be easily grasped by the operator's hand, and the operation of detaching the pack device from the pack receptacle can be improved.

To contain the pack device, the first end portion of the pack device is inserted to the pack receptacle such that the second connector provided at the first end portion is brought into contact with the first connector. Next, the first end portion is used as a fulcrum, and the pack device is rotated in the direction of the pack receptacle, and the second end portion of the pack device is inserted to the pack receptacle.

In this case, since the slider is automatically returned to the lock position by the spring force, the second end portion of the pack device is inserted to the pack receptacle, so that the convex portion of the pack device comes in contact with the second cam portion of the slider. Due to this, the slider is moved to the lock releasing position from the lock position based on the contact between the second cam portion and the convex portion. If the convex portion is mounted over the second cam portion in accordance with the rotation of the pack device, the convex portion reaches the first cam portion through the insertion port, and the slider is returned to the lock position from the lock releasing position by the spring force. Due to this, the convex portion is guided to the engaging portion along the first cam portion to be hooked on the engaging portion. Thereby, the pack device is locked onto the pack receptacle, and the pack device can be prevented from being detached from the pack receptacle.

Moreover, according to the present invention, there is provided a portable apparatus comprising:

a housing having a bottom wall;

a pack receptacle formed in said housing, said pack receptacle having an opening portion formed on said bottom wall, a first end section having a first connector, and a second end section facing to the first end section, and said first connector being continuous to said opening portion; and a pack device contained in said pack receptacle to be detachable through said opening portion, said pack device having a first end portion, a second end portion positioned to be opposite to the first end portion, and said first end portion having a second connector contacting said first connector.

wherein said pack device has a convex portion on said second end portion, said pack receptacle has lock means for maintaining said pack device at said pack receptacle on said second end section, said lock means has a slider movable between a lock position and a lock releasing position and maintained at said lock position, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position, and said pack receptacle and said pack device have engaging means for engaging said pack receptacle and said pack device with each other when said pack device is contained in said pack receptacle in a correct position.

Also, according to the present invention, there is provided a portable apparatus comprising:

a housing having an opening portion;

a pack receptacle formed in said housing, said pack receptacle having a first end section on which a first connector is provided, and a second end section facing to the first end section, so as to be continuous to said opening portion; and a pack device detachably contained in said pack receptacle through said opening portion, and said pack device has a first end portion and a second end portion positioned to be opposite to said first end portion, and said first end portion has a second connector contacting said first connector;

wherein said pack device has a convex portion on said second end portion, said pack receptacle has lock means for maintaining said pack device at said pack receptacle on said second end section, said lock means has a slider movable between a lock position and a lock releasing position and maintained at said lock position, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position, and said pack receptacle and said pack device have engaging means for engaging said pack receptacle and said pack device with each other when said pack device is contained in said pack receptacle in a correct position.

According to the above-mentioned structure, if the pack device is erroneously turned over and inserted to the pack receptacle, engaging means cannot be engaged with each other. As a result, the pack device cannot be inserted to the pack receptacle any more. Then, the user notices that the pack device is turned over. Therefore, it is possible to prevent the pack device from being forcibly inserted to the pack receptacle in advance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view of a portable computer of an embodiment of the present invention;

FIG. 11A is a cross-sectional view of the battery receptacle showing a state that the slider is slid to the lock position;

FIG. 11B is a cross-sectional view of the battery receptacle showing a state that the slider is slid to the lock releasing position;

FIG. 12 is a cross-sectional view of the battery receptacle showing a state that a convex portion of the battery pack comes in contact with a second cam portion;

FIG. 13 is a cross-sectional view of the housing showing a state that the slider is attached to a guide groove;

FIG. 15A is a plan view of the housing showing a state that the slider is slid to the lock position;

FIG. 15B is a plan view of the housing showing a state that the slider is slid to the lock releasing position;

FIG. 16 is a cross-sectional view of the battery pack;

FIG. 17 is a perspective view showing the slider and a compression coil spring for compressing the slider;

FIG. 18A is a side view of the slider showing a state that a guide projection of the battery pack comes in contact with the second cam portion; and FIG. 18B is a side view of the slider showing a state that the guide projection of the battery back moves along the cam surface of a first cam portion.

DETAILED DESCRIPTION OF THE INVENTION

An embodiment of the present invention will be described with reference to the drawings.

Figure 2:
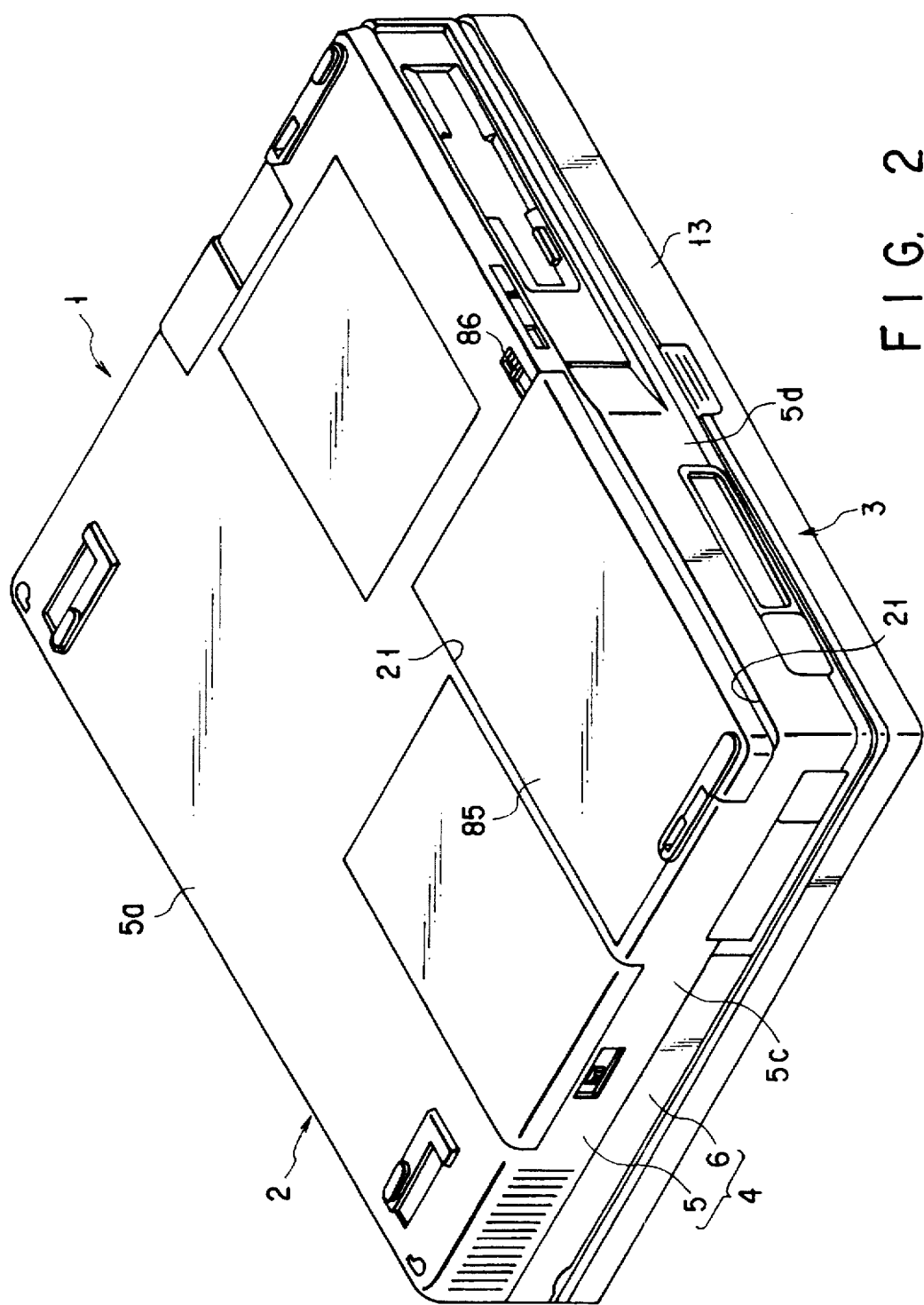
FIG. 2 is a perspective view seeing from the bottom side of the portable computer.

FIGS. 1 and 2 show a book-type portable computer 1 of A4 size. The portable computer 1 comprises a main body 2 and a display unit 3 supported by the main body 2.

The main body 2 has a flat and box-shaped housing 4. The housing 4 comprises a lower housing 5 and an upper housing 6 connected to the lower housing 5. The lower housing 5 has a bottom wall 5a, a pair of side walls 5b, 5c, a front wall 5d, and a back wall (not shown). These side walls 5b, 5c, the front wall 5d, and the back wall extend upward from an peripheral portion of the bottom wall 5a.

Figure 4:
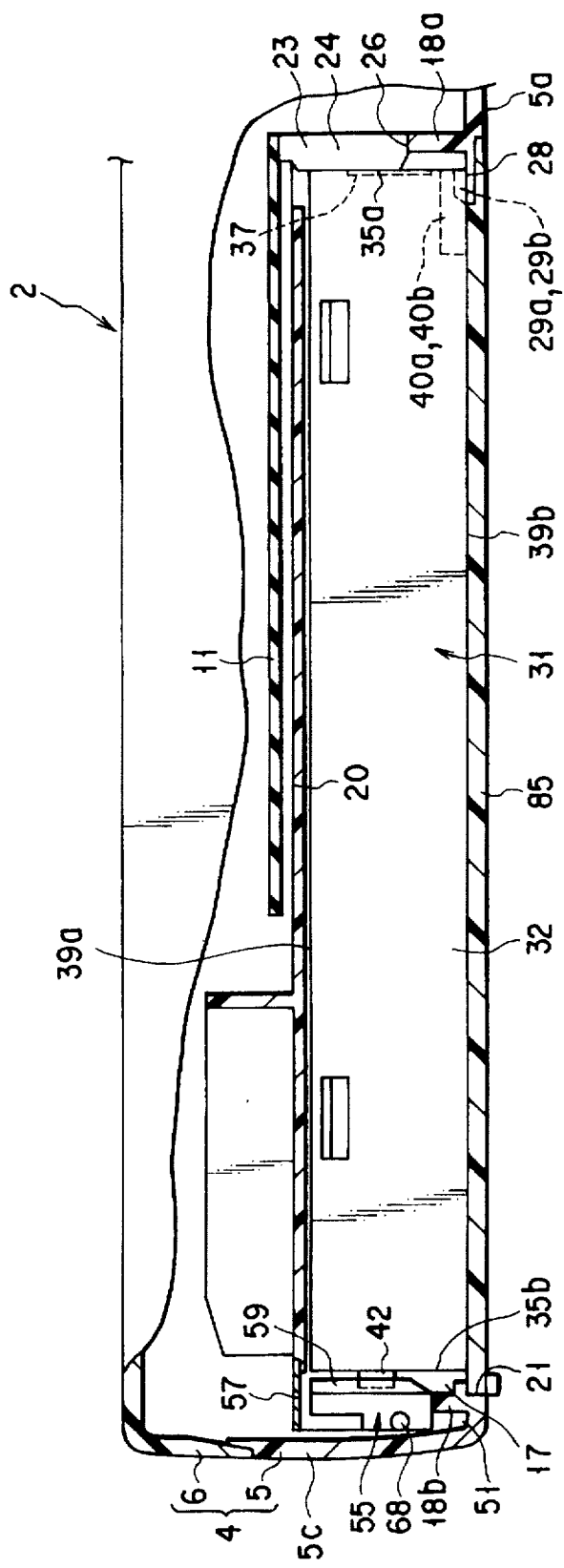
FIG. 4 is a cross-sectional view showing a state that the battery pack is completely contained in the battery receptacle.

The upper housing 6 is plate-shaped to be substantially flat. A peripheral portion of the upper housing 6 is continuous to the side walls 5b and 5c, the front wall 5d, and the back wall. The upper housing 6 has a first half portion and a second half portion. The first half portion of the upper housing 6 is used as an arm rest 7. A pair of click switch buttons 8a and 8b are provided on substantially central portion of the arm rest 7. The second half portion of the upper housing 6 has a keyboard 10. As shown in FIG. 4, a circuit board 11 is contained in the housing 4. The circuit board 11 is provided to be parallel to the bottom wall 5a of the lower housing 5.

The display unit 3 comprises a display housing 13, which is flat and box-shaped, and a color liquid crystal display (LCD) 14 contained in the display housing 13. The display housing 13 has a front surface having a display window 15 opened. LCD 14 has a screen 14a on which information such as characters and graphics is display. The screen 14a is exposed outward the display window 15 of the display housing 13.

The display unit 3 is rotatably supported through a hinge device (not shown) at the back end portion of the housing 4. Due to this, the display unit 3 is rotatable between a closing position where the arm rest 7 and the keyboard 10 are covered, and an opening position where the arm rest 7 and the keyboard 10 are exposed.

Figure 3:
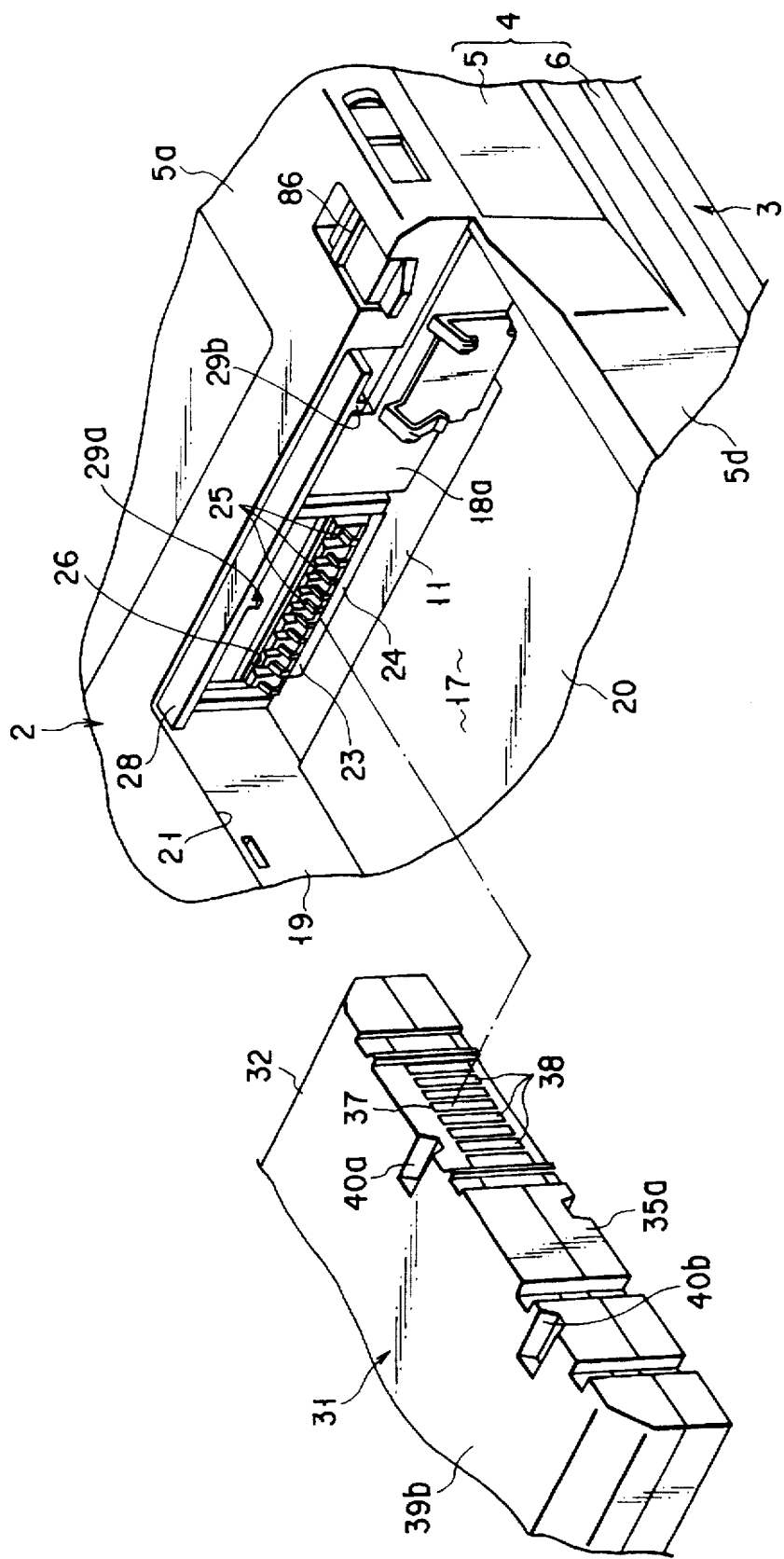
FIG. 3 is a perspective view showing the relationship between a first connector placed in a battery receptacle and a second connector of a battery pack.
Figure 5:
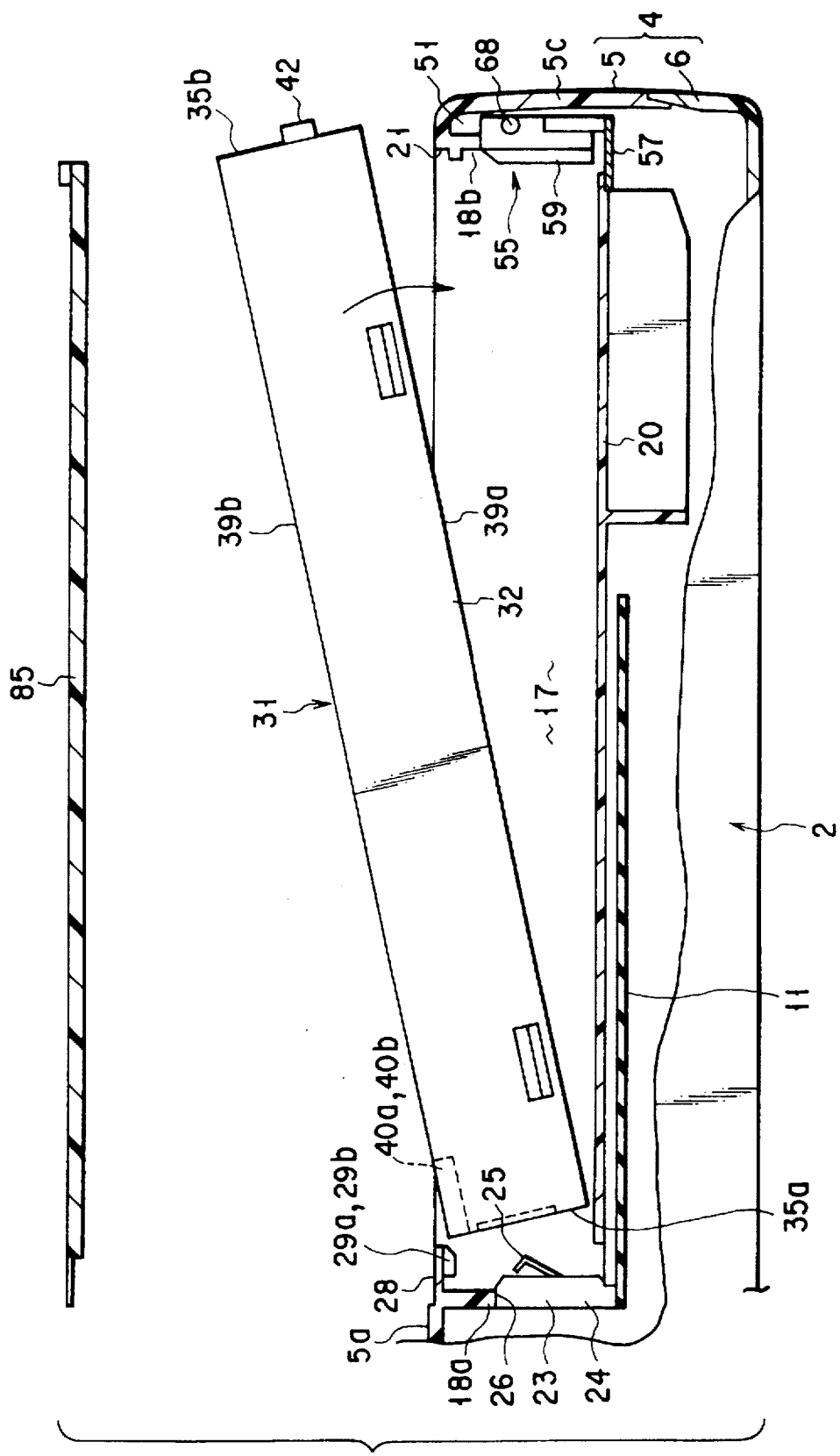
FIG. 5 is a cross-sectional view showing a state that a first end portion of the battery pack is inserted to the battery receptacle.
Figure 6:
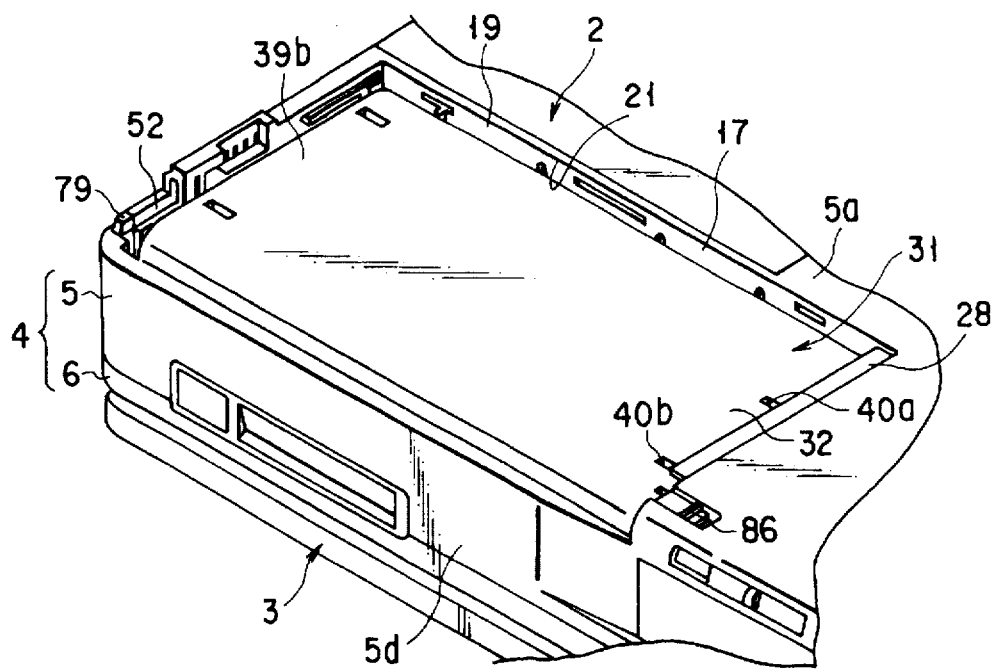
FIG. 6 is a perspective view showing a state that the battery pack is completely contained in the battery receptacle.

As shown in FIGS. 3 to 5, the housing 4 comprises a battery receptacle 17 as a pack receptacle. The battery receptacle 17 extends in a width direction of the housing 4 at the lower portion of the right half of the arm rest 7. The battery receptacle 17 is defined by a first end wall 18a, a second end wall 18b, a side wall 19, and a ceiling wall 20. The first and second end walls 18a and 18b, and the side wall 19 are extend upward from the bottom wall 5a of the lower housing 5. The ceiling wall 20 is continuous to the first and second end walls 18a, 18b, and the side wall 19. The first and second end walls 18a and 18b are arranged to be spaced from each other in the width direction of the housing 4. The first end wall 18a has a connector outlet 26, which is continuous to the battery receptacle 17. The second end wall 18b is placed to be parallel to the side wall 5c at the position adjacent to the side wall 5c. The side wall 19 is positioned to be separated in a depth direction of the housing 2 than the front wall 5d of the housing 4. Then, the side wall 19 and the front wall 5d are faced to each other. The ceiling wall 20 faces to the inner surface of the arm rest 7. A part of the circuit board 11 is positioned at the upper portion of the ceiling wall 20.

The battery receptacle 17 has an opening portion 21. The opening portion 21 is opened to the bottom wall 5a of the lower housing 5 to face to the ceiling wall 20. The opening portion 21 has a rectangular shape having a long axis extending to the width direction of the housing 4 and a short axis extending to the depth direction of the housing 4.

As shown in FIGS. 3 and 4, the battery receptacle 17 has a first connector 23. The first connector 23 has a connector body 24, and a plurality of contact terminals 25 supported by the connector body 24. The connector body 24 is supported by the back surface of the circuit board 11 to be adjacent to the first end wall 18a. The contact terminals 25 are exposed to the battery receptacle 17 through the connector outlet 26. The contact terminals 25 are arranged in a row in the direction of the depth of the housing 4. The contact terminals 25 expands to the battery receptacle 17 rather than the first end wall 18a. The top ends of the respective contact terminals 25 are directed to the opening portion 21 of the battery receptacle 17. The contact terminals 25 can be elastically deformed in a direction where they are drawn back to the interior of the connector body 24.

As shown in FIG. 3 or 5, the battery receptacle 17 has a guide wall 28. The guide wall 28 is positioned at the opening periphery of the opening portion 21, which is continuous to the first end wall 18a. The guide wall 28 extends along the depth direction of the housing 4. The guide wall 28 expands to the second end wall 18b rather than the contact terminals 25 of the first connector 23. Due to this, as shown in FIG. 3, the guide wall 28 is positioned above the contact terminals 25 in a state that the bottom wall 5a of the housing 4 is set upward.

The guide wall 28 has a flat upper surface facing to the ceiling wall 20. On the upper surface, a pair of convex portions 29a and 29b is formed. The convex portions 29a and 29b are arranged to be separated from each other in the depth direction of the housing 4.

The battery receptacle 17 contains a battery pack 31 to be detachable as a pack device. The battery pack 31 functions as a driving power supply when the computer 1 used at a place where no commercial power supply cannot be obtained. The battery pack 31 is detachably contained in the battery receptacle 17 through the opening portion 21.

As shown in FIG. 16, the battery pack 31 comprises a synthetic resin-made battery case 32, a plurality of nickel-hydrogen secondary batteries 33, and a temperature fuse (not shown). The battery case 32 is rectangular box-shaped to have a size large enough to be just fitted to the battery receptacle 17. The battery case 32 has first and second end surfaces 35a and 35b facing to each other to sandwich the secondary battery 33. The first end surface 35a faces to the first end wall 18a of the battery receptacle 17 and the first connector 23. The second end surface 35b faces to the second end wall 18b of the battery receptacle 17.

As shown in FIG. 3, the battery pack 31 has a second connector 37. The second connector 37 is placed at a first end surface 35a of the battery case 32. The second connector 37 has a plurality of terminal plates 38. The terminal plates 38 are electrically connected to the secondary battery 37 or the temperature fuse. The terminal plates 38 are arranged in a row to have a distance in order to correspond to the contact terminals 25 of the first connector 23.

The battery case 32 has a flat upper surface 39a and a flat lower surface 39b. The upper and lower surfaces 39a and 39b are continuous to the first and second end surfaces 35a and 35b. A pair of concave portions 40a and 40b are formed at a corner portion, which is defined by the first end surface 35a and the lower surface 39b. The concave portions 40a and 40b are arranged to be spaced from each other to correspond to the convex portions 29a and 29b of the battery receptacle 17.

Due to this, it is assumed that the battery pack 31 is inserted to the battery receptacle 17 in a state that the first end surface 35a is set as a head. If the inserting position of the battery pack 31 is correct, the concave portions 40a and 40b and the convex portions 29a and 29b are conformed to each other. As a result, the convex portions 29a and 29b are inserted to the concave portions 40a and 40b. If the battery pack 31 is inserted to the battery receptacle 17 in a state that the battery pack 31 is turned over, the concave portions 40a and 40b face to the ceiling wall 20 of the opposite side of the convex portions 29a and 29b. Therefore, the corner portion, which is defined by the first end surface 35a and the lower surface 39b, contacts the convex portions 29a and 29b. As a result, the battery pack 31 cannot be inserted to the battery receptacle 17 any more. Due to this, according to the embodiment, the convex portions 29a and 29b and the concave portions 40a and 40b constitute engaging means for fixing the direction of the battery pack 31 when the battery pack 31 is inserted to the battery receptacle 17.

Figure 9:
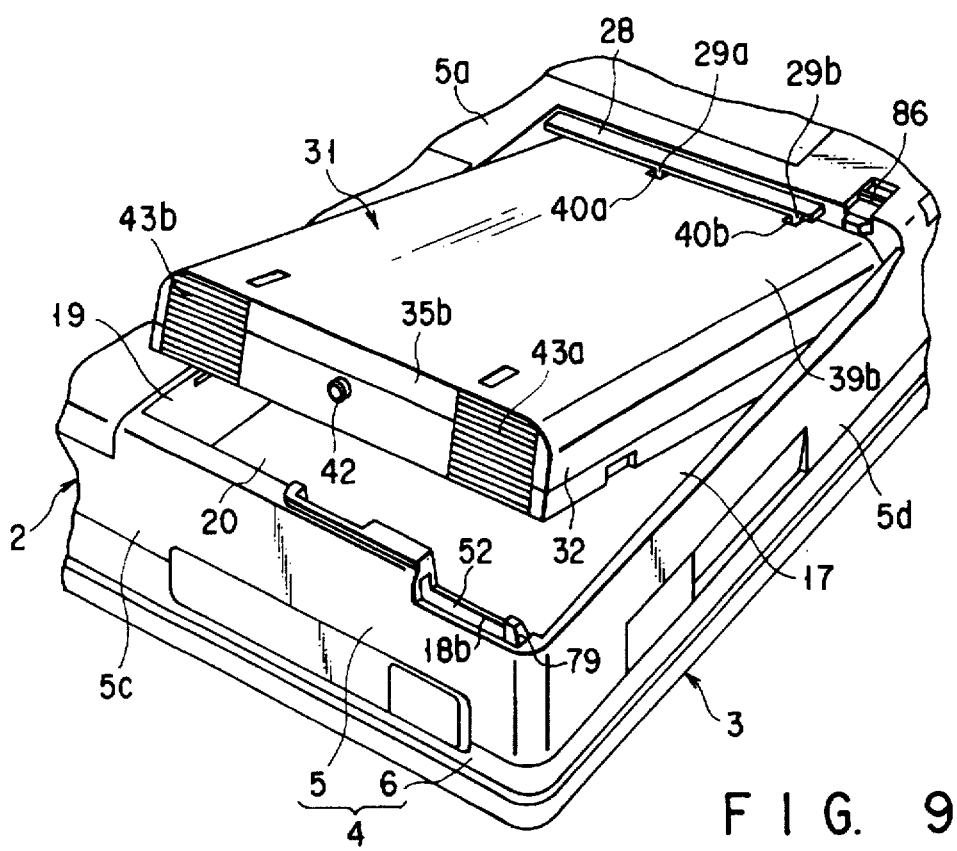
FIG. 9 is a perspective view showing a state that the first end portion of the battery pack is inserted to the battery receptacle.

As shown in FIGS. 5 and 9, the battery case 32 comprises a pillar-shape (cylindrical) convex portion 42. The convex portion 42 is positioned at substantially the central portion of the second end surface 35b of the battery case 32 to be opposite to the second connector 37. The convex portion 42 is formed to face to the first end wall 18a of the battery receptacle 17. A pair of non-slip portions 43a and 43b is provided on the second end surface 35b of the battery case 32. The non-slip portions 43a and 43b have a large number of notches for hooking fingers. The convex portion 42 is positioned between the non-slip portions 43a and 43b.

Figure 10A:
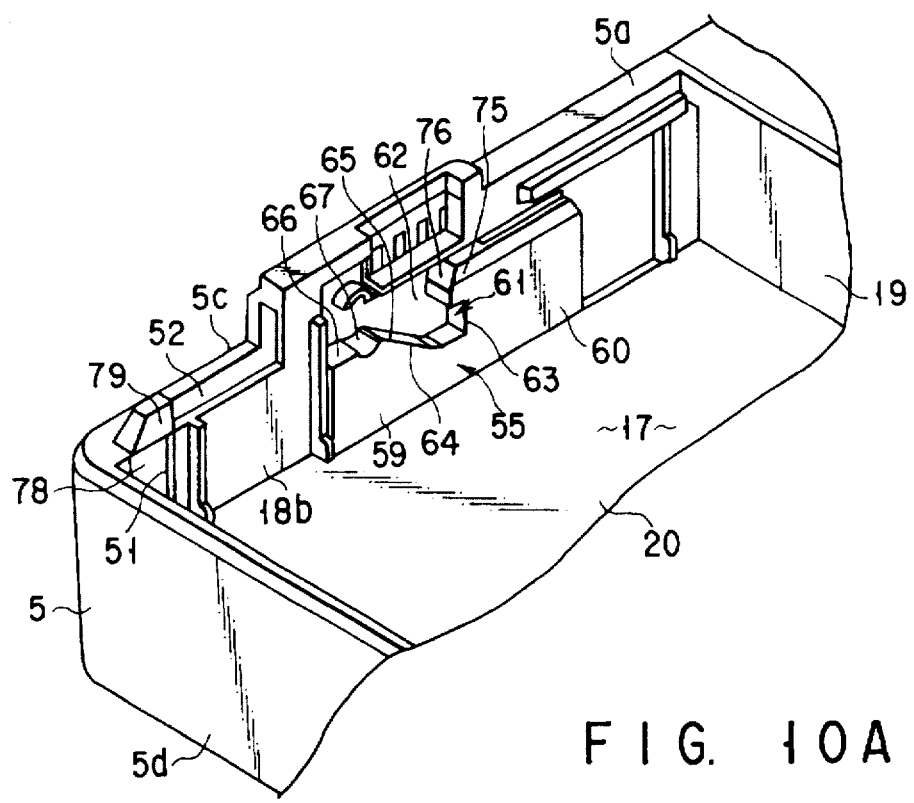
FIG. 10A is a perspective view of the battery receptacle showing a state that a slider is slid to a lock position.
Figure 10B:
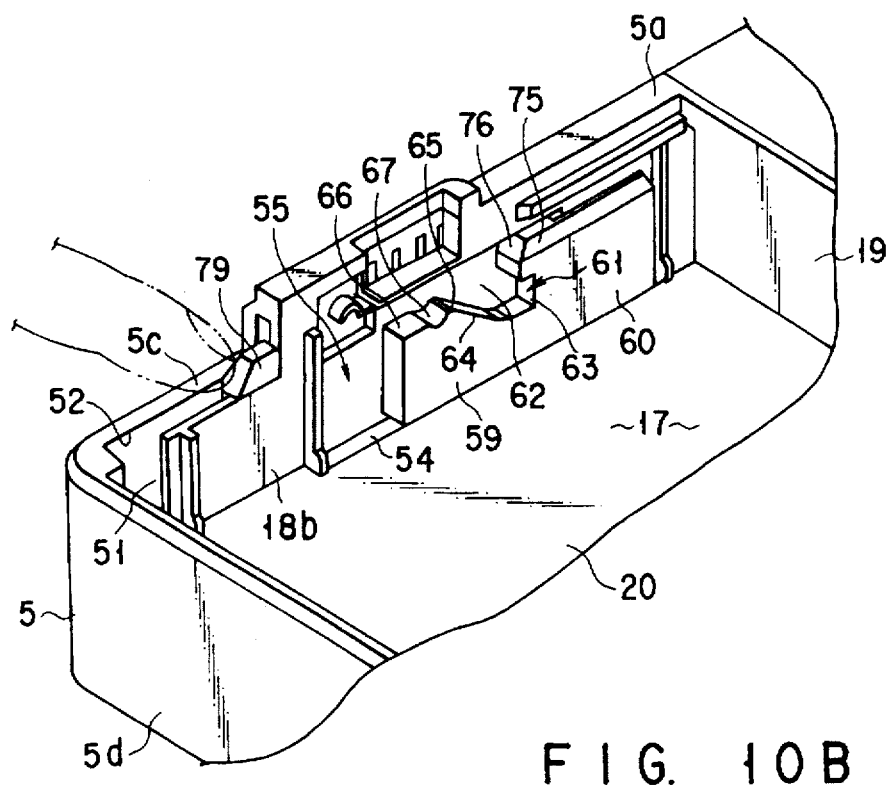
FIG. 10B is a perspective view of the battery receptacle showing a state that the slider is slid to a lock releasing position.

As shown in FIGS. 10B, 13, 15A and 15B, the side wall 5c of the housing 4 and the second end wall 18b of the battery receptacle 17 constitute the guide groove 51 in cooperation with each other. The guide groove 51 extends along the depth direction of the housing 4. As shown in FIGS. 9, 10A, and 10B, the guide groove 51 has a slit-shaped insertion hole 52. The insertion hole 52 is formed at the lower end of the side wall 5c, which is continuous to the opening periphery of the opening portion 21. The insertion hole 52 extends in the depth direction of the housing 4.

At the central portion of the second end wall 18b of the battery receptacle 17, a through hole 54 is formed. The through hole 54 to be continuous to the guide groove 51. The through hole 54 has an opening shape extending in the depth direction of the housing 4.

A slider 55 is provided in the guide groove 51 as shown in FIG. 17. The slider 55 is used as means for locking the battery pack 31 to the battery receptacle 17 or release the lock of the battery pack 31. The slider 55 is flat plate-shaped. The slider 55 is contained to be slidable onto the guide groove 51 such that the slider 55 is held by the guide groove 51 through a plate 57 (FIGS. 4 and 5). Due to this, the slider 55 is slid linearly to the depth direction of the housing 4.

The slider 55 has a guide wall portion 59. The guide wall portion 59 is exposed to the battery receptacle 17 through the through hole 54 of the second end wall 18b. The guide wall portion 59 has a flat surface 60 facing to the second end surface 35b of the battery pack 31. The surface 60 has a groove-shaped lock portion 61 formed. As shown in FIGS. 10A, 10B, 11A, and 11B, the lock portion 61 comprises an insertion port 62, which is opened at the upper periphery portion of the guide wall portion 59, an engaging portion 63, which is positioned at the lower portion than the insertion port 62, and a first cam portion 64, which connects the engaging portion 63 to the insertion port 62, in a state that the bottom wall 5a of the housing 4 is turned upward.

The insertion port 62, through which the convex portion 42 of the battery pack 31 can be passed, is continuous to the opening portion 21 of the battery receptacle 17 through the through hole 54. The engaging portion 63 has a concavity in which the convex portion 42 is detachably fitted. The first cam portion 64 has a cam surface 65 with which the convex portion slidably comes in contact. The cam surface 65 is inclined in the direction approaching the opening portion 21 of the battery receptacle 17 as the cam surface 65 advances from the engaging portion 63 to the insertion port 62. The cam surface 65 has an extension 66, which extends horizontally, at the end portion, which is continuous to the insertion port 62. In the extension 66, there is formed a cavity 67 on which the convex portion 62 is detachably hooked.

In a state that the battery pack 31 is contained in the battery receptacle 17, if the slider 55 is slid in the depth direction of the housing 4, the convex portion 42 of the battery pack 31 moves along the cam surface 65 of the lock portion 61. Due to this, the slider 55 can be slid between a lock position where the convex portion 42 is fitted to the engaging portion 63 and a lock releasing position where the convex portion 42 is hooked on the cavity 67, as shown in FIG. 18B. By the engagement of the convex portion 42 with the engaging portion 63, the battery pack 31 is locked to the battery receptacle 17.

Figure 14A:
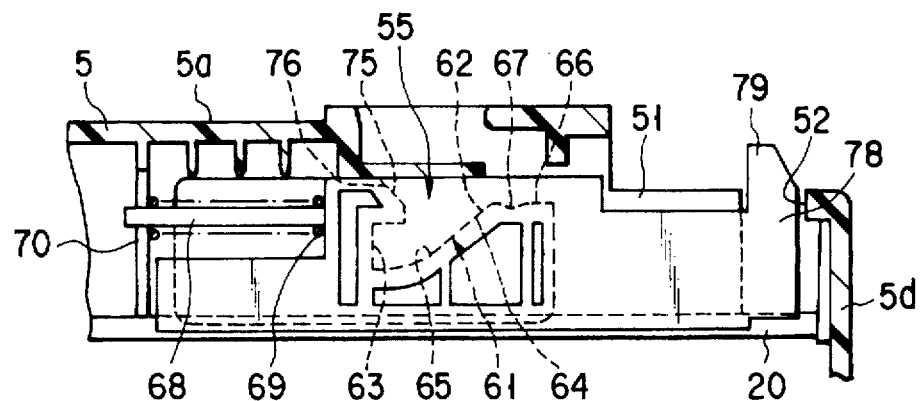
FIG. 14A is a cross-sectional view of the housing showing a state that the slider is slid to the lock position.
Figure 14B:
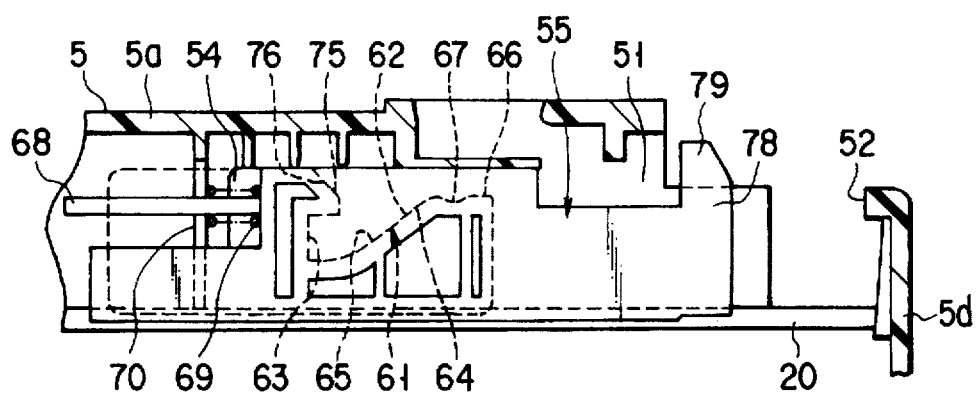
FIG. 14B is a cross-sectional view of the housing showing a state that the slider is slid to the lock releasing position.

As shown in FIGS. 14A, 14B and 17, the slider 55 comprises a guide pin 68. The guide pin 68 is positioned in the guide groove 51. A compression coil spring 69 is attached onto the guide pin 68. As shown in FIGS. 15A and 15B, the compression coil spring 69 is contained in the guide groove 51. Spring seats 70 are provided on an inner surface of the side wall 5b and an inner surface of the second end wall 18b. One end of the compression coil spring 69 is hooked on the spring seats 70. Due to this, the compression coil spring 69 is compressed between the spring seats 70 and the slider 55. By the compression of the compression coil spring 69, the slider 55 is pressed to the lock position to be held at the lock position.

As shown in FIG. 17, the guide wall portion 59 of the slider 55 comprises a second cam portion 75. The second cam portion 75 is positioned above the engaging portion 63 to be continuous to the insertion port 62 in a state that the bottom wall 5a of the housing 4 is set upward. The second cam portion 75 has a cam surface 76 where the convex portion 42 slidably contacts. The cam surface 76 is inclined downward from the upper edge of the guide wall portion 59. The direction of the inclination of the cam surface 76 is opposite to that of the cam surface 65 of the first cam portion 64. The lower end of the cam surface 76 faces to the intermediate portion of the cam surface 65.

Due to this, if the battery pack 31 is contained in the battery receptacle 17, the convex portion 42 of the battery pack 31 comes in contact with the cam surface 76 of the second cam portion 75. By this contact, the slider 55 is pressed to the lock release position from the lock position.

As shown in FIG. 17, the slider 55 comprises a lever section 78. The lever section 78 manually operates the slider 55 to the lock releasing position from the lock position. As shown in FIGS. 10A, 10B, 14A, and 14B, the top end of the lever section 78 is exposed to the outside of the housing 4 through the insertion port 52. At the top end portion of the lever section 78, a finger hooking portion 79 is formed to hook the operator's finger.

As shown in FIGS. 2 and 5, the housing 4 comprises a battery cover 85. The battery cover 85 is detachably supported by the bottom wall 5a of the lower housing 5. The battery cover 85 covers the opening portion 21 of the battery receptacle 17 and the lever section 78 of the slider 55. The battery cover 85 has substantially the same size as the opening shape of the opening portion 21.

As shown in FIGS. 2 and 3, a lock lever 86 is provided at the bottom wall 5a of the lower housing 5. The lock lever 86 is supported to be slidable between the lock position where the lock lever 86 is hooked on the battery cover 85 and the lock releasing position where the lock lever 86 is detached from the battery cover 85. Due to this, the battery cover 85 is held by the lower housing 5 by the engagement with the lock lever 86. If the lock lever 86 is slid to the lock releasing position, the battery cover 85 can be detached from the lower housing 5.

The following will explain the steps of detaching the battery pack 31 from the battery receptacle 17 in the above-structured computer 1.

First, the computer 1 is turned over to the bottom wall 5a of the housing 4 is set upward. Next, the lock lever 86 is slid from the lock position to the lock releasing position.

Thereby, the lock of the battery cover 85 is released by the lock lever 86, and the battery cover 85 is detached from the lower housing 5. As a result, the opening portion 21 of the battery receptacle 17 is opened, and the battery pack 31 and the lever section 78 of the slider 55 is exposed.

Then, the operator hooks the tip of his finger on the finger hooking portion 79 of the lever section 78 to slide the slider 55 to the lock releasing position from the lock position against urging force of the compression coil spring 69. By this sliding operation, the engaging portion 63 of the lock portion 61 is detached from the convex portion 42 of the battery pack 31, so that the engagement of the slider 55 with the convex portion 42 is released.

The convex portion 42 detached from the engaging portion 63 reaches the first cam portion 64 in accordance with the slide of the slider 55, and comes in contact with the cam surface 65. The cam surface 65 is inclined to the direction approaching the opening portion 21 of the battery receptacle 17 in accordance with advancement to the insertion port 62 from the engaging portion 63. Due to this, as shown in FIG. 18B, the convex portion 42 is pressed up to the opening portion 21 based on the inclination of the cam surface 65. As shown in FIG. 11B, the convex portion 42 is guided to the extension 66 of the cam surface 65 through the insertion port 62 so as to be hooked on the cavity 67 of the extension 66. As a result, the slider 55 is temporarily held by the lock release position.

Figure 7:
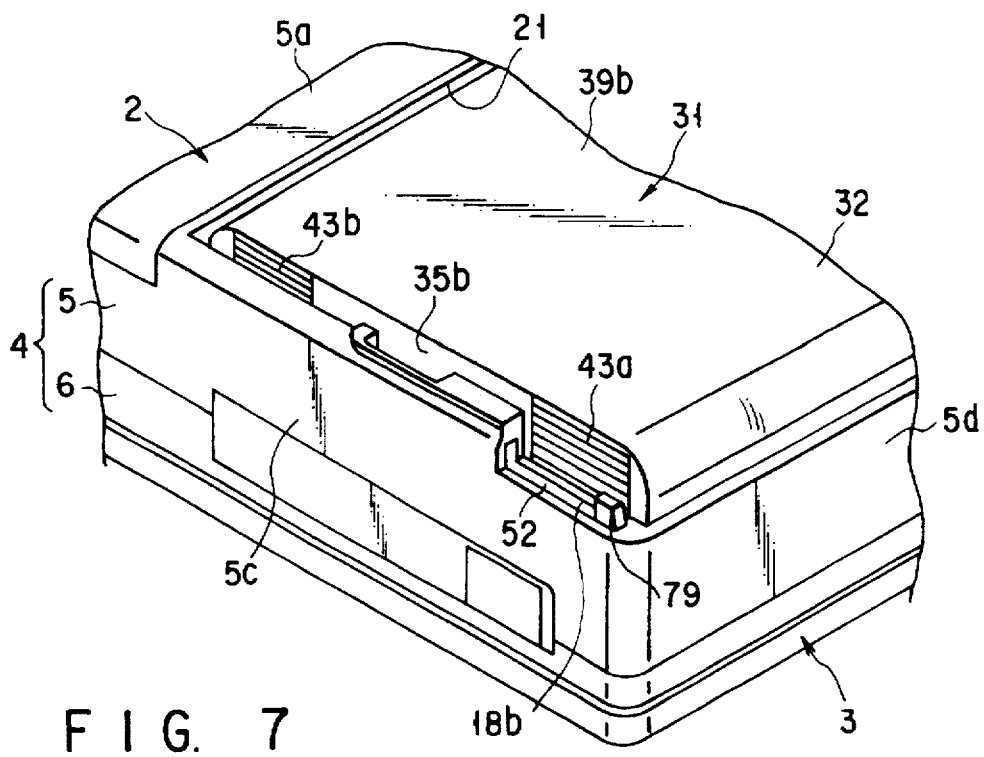
FIG. 7 is a perspective view showing a state that a second end portion of the battery pack is pushed out of an opening portion of the battery receptacle.

If the convex portion 42 is pressed up by the cam surface 65, the battery pack 31 rotates upward in a state that the contact portion of the first connector 23 with the second connector 37 is used as a fulcrum. Thereby, as shown in FIG. 7, the second end surface 35b of the battery case 32 having the convex portion 42 projects from the opening portion 21, and the non-slip portions 43a and 43b, which are positioned at the second end surface 35b, are exposed to the outside of the opening portion 21.

In this state, the operator hooks his finger on the non-slip portions 43a and 43b. Then, the end portion of the battery pack 31, which is continuous to the second end surface 35b, is pressed up to be detached from the opening portion 21. By this operation, the end portion of the battery pack 31 is largely pressed to the outside of the lower housing 5 through the opening portion 21. Then, the operator grasp the end portion of the battery pack 31 by his hand to be drawn from the battery receptacle 17. Thereby, a series of steps of detaching the battery pack 31 is completed.

If the end portion of the battery pack 31 is pushed out of the opening portion 21, the convex portion 42 is detached from the cavity 67 of the slider 55. Due to this, the maintenance of the slider 55 is released, and the slider 55 is automatically returned to the lock position from the lock releasing position.

Figure 8:
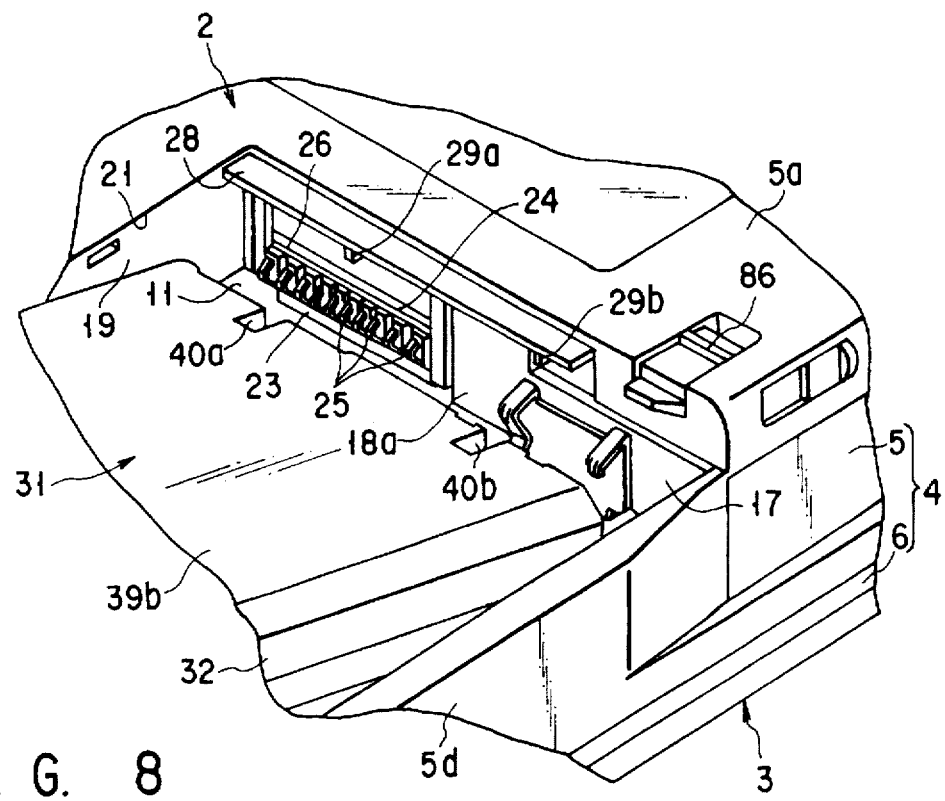
FIG. 8 is a perspective view showing the positional relationship between concave portions of the battery pack and convex portions of the battery receptacle in a state that the first end portion of the battery pack is inserted to the battery receptacle.

To contain the battery pack 31 in the battery receptacle 17, the computer 1 is turned over, and the bottom wall 5a of the housing 4 is set upward. Next, the battery cover 85 is detached from the lower housing 5, and the battery pack 31 is inserted to the battery receptacle 17 from the opening portion 21. In this case, the battery receptacle 17 has the guide wall 28 expanding to the upper portion of the contact terminals 25 of the first connector 23. Due to this, as shown in FIGS. 5 and 8, the battery pack 31 is inserted to the battery receptacle 17 in an inclined lower position in a state that the first end surface 35a having the second connector 37 is set as a head.

In other words, the contact terminals 25 of the first connector 23 expand to the battery receptacle 17 rather than the first end wall 18. Also, the top end is directed to the opening portion 21. Due to this, it is assumed that the battery pack 31 is dropped into the battery receptacle 17 in a horizontal position to be parallel to the ceiling wall 20 of the battery receptacle 17. The corner portion of the battery case 32, which is defined by the first end surface 35a and the upper surface 39a, is hooked on the top end of the contact terminals 25. If the operator pushes the battery pack 31 to the battery receptacle 17 without knowing the above fact, the contact terminals 25 are crushed by the battery pack 31. As a result, there is possibility that the first connector 23 will be broken.

According to the above-structured computer 1, if the battery pack 31 is dropped into the battery receptacle 17 in a horizontal position, the corner portion of the battery case 32 is hooked on the guide wall 28 before the corner portion comes in contact with the contact terminals 25. Then, the battery pack 31 cannot be dropped into the battery receptacle 17 any more. Due to this, the corner portion of the battery case 32 and the contact terminals 25 are not interfered with each other, and the breakage of the contact terminals 25 can be prevented.

As shown in FIG. 5, if the battery pack 31 is inserted to the battery receptacle 17 in an inclination position, the contact terminals 25 of the first connector 23 and the terminal plate 38 of the second connector 37 are faced each other. In this state, the end portion of the second connector 37 of the battery pack 31 is inserted between the guide wall 28 and the ceiling wall 20. In this case, the guide wall 28 has the pair of convex portions 29a and 29b. Then, if the battery pack 31 is inserted to the battery receptacle 17 in a correct direction, the concave portions 40a and 40b of the battery pack 31 correspond to the convex portions 29a and 29b, and the convex portions 29a and 29b are inserted to the concave portions 40a and 40b. Due to this, the insertion operation of the battery pack 31 is not prevented, and the terminal plate 38 of the second connector 37 comes in contact with the contact terminals 25 of the first connector 23.

If the battery pack 31 is erroneously turned over, and inserted to the battery receptacle 17, the concave portions 40a and 40b of the battery pack 31 face to the ceiling wall 20, which is opposite to the convex portions 29a and 29b. Due to this, even if the battery pack 31 is inserted between the ceiling wall 20 and the guide wall 28, the convex portions 29a and 29b contact the corner portion of the battery case 32, which is defined by the first end surface 35a and the upper surface 39a. As a result, the battery pack 31 cannot be inserted to the battery receptacle 17 any more. Then, the user can become aware that the position of the battery pack 31 is turned over. Therefore, it is possible to prevent the erroneous operation in which the battery pack 31 is forcibly inserted to the battery receptacle 17 in advance. Moreover, the damage of the first connector 23, which is caused by the erroneous, can be prevented.

If the terminal plates 38 of the second connector 37 contacts the contact terminals 25 of the first connector 23, the battery pack 31 is rotated downward in a state that the contact portion is used as a fulcrum. Then, the end portion of the convex portion 42 of the battery pack 31 is dropped to the battery receptacle 17. At this time, as shown in FIG. 12, since the slider 55 for locking the battery pack 31 is maintained at the lock position, the convex portion 42 comes in contact with the cam surface 76 of the second cam portion 75 of the slider 55.

If the battery pack 31 is further rotated from this state, the cam surface 76 is pressed by the convex portion 42, so that the slider 55 is slid to the lock releasing position from the lock position. By this sliding operation, if the convex portion 42 mounts over the cam surface 76, the convex portion 42 reaches the cam surface 76 of the first cam portion 64 through the insertion port 62, and the pressurization of the cam surface 76 due to the convex portion 42 is released.

As a result, the slider 55 is forcibly returned to the lock position from the lock releasing position by the compression coil spring 69. Then, the convex portion 42 reaches the engaging portion 63 through the cam surface 65 of the first cam portion 64. At this time, as shown in FIG. 11A, the battery pack 31 is completely inserted to the battery receptacle 17, and the upper surface 39a of the battery case 32 is overlaid on the ceiling wall 20.

Since the slider 55 is maintained at the lock position by the compression coil spring 69, the engagement of the engaging portion 63 with the convex portion 42 is maintained. As a result, the battery pack 31 is locked to be contained in the battery receptacle 17, and the detachment from the battery receptacle 17 or the unstable state can be prevented.

Finally, the battery cover 85 is attached to the bottom wall 5a of the lower housing 5 to cover the battery pack 31 and the lever 78 of the slider 55. Thereby, a series of steps of containing the battery pack 31 is completed.

According to the computer 1, the lock of the battery pack 31 is released and the end portion of the battery pack 31 is pressed out of the opening portion 21 of the battery receptacle 17 at the same time. Due to this, the end portion of the pressed battery back 31 can be easily grasped by the operator's hand. It is unnecessary to provide a complicated work in which the heavy and large battery pack 31 is pulled out of the battery receptacle 17 as releasing the lock of the battery pack 31. Then, as compared with the conventional case, the battery pack 31 can be easily taken out of the battery receptacle 17.

Furthermore, if the battery pack 31 is inserted to the battery receptacle 17, the convex portion 42 first comes in contact with the second cam portion 75, and the slider 55 is temporarily slid to the lock releasing position. As a result, the convex portion 42 can be lead to the first cam portion 64 without operating the slider 55 manually.

If the convex portion 42 mounts over the second cam portion 75, the slider 55 is forcibly returned to the lock position from the lock releasing position by the compression coil spring 69. Then, the engaging portion 63 of the slider 55 is engaged with the convex portion 42, and the battery pack 32 is automatically locked. As a result, the operator can easily carry out the containing work of the battery pack 31 without noticing the lock of the battery pack 31 and manually operating the slider 55 at the time of inserting the battery pack 31.

According to the above-mentioned structure, the battery pack 31 contained in the battery receptacle 17 and the lever section 78 of the slider 55 are covered with the battery cover 85. Due to this, as long as the battery cover 85 is not detached from the lower housing 5, the slider 55 cannot be slid to the lock releasing position from the lock position. As a result, the careless lock releasing of the battery pack 31 can be prevented in advance.

Moreover, according to the above-mentioned embodiment, the opening portion of the battery receptacle is formed on the bottom wall of the housing. However, the present invention is not limited to the above embodiment. For example, the opening portion may be formed on the side wall of the housing or the upper wall.

Furthermore, in the computer of the present invention, the pack device is not limited to the battery pack. For example, a hard disk drive device or a floppy disk drive device, or a CD-ROM drive device may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A portable apparatus comprising:

a housing having a bottom wall;

a pack receptacle formed in said housing, said pack receptacle having an opening portion formed on said bottom wall, a first end section having a first connector, and a second end section facing to the first end section, and said first connector being continuous to said opening portion; and a pack device contained in said pack receptacle to be detachable through said opening portion, said pack device having a first end portion, a second end portion positioned to be opposite to the first end portion, and said first end portion having a second connector contacting said first connector, wherein said pack device has a convex portion on said second end portion, said pack receptacle has lock means for maintaining said pack device at said pack receptacle on said second end section, said lock means has a slider movable between a lock position and a lock releasing position and maintained at said lock position through spring means, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position.

2. The apparatus according to claim 1, wherein said first cam portion has a cam surface, which is inclined to a direction approaching the opening portion of said pack receptacle as advancing to said insertion port from said engaging portion.

3. The apparatus according to claim 1, wherein said first cam portion of said slider has an end portion facing to said insertion port, and said end portion has a concave portion on which said convex portion is detachably hooked.

4. The apparatus according to claim 1, wherein said slider has a lever portion, which is manually operated when said slider is moved to the lock releasing position from the lock position, and the lever portion is exposed to said opening portion.

5. The apparatus according to claim 4, wherein said housing has a detachable cover covering the opening portion of said pack receptacle, and the cover is formed to be continuous to the bottom wall of said housing to cover said lever portion.

6. The apparatus according to claim 1, wherein said pack device is a battery pack having a box-shaped case, which is detachably inserted to said pack receptacle, and a plurality of secondary batteries contained in the case.

7. The apparatus according to claim 1, wherein said first connector has a plurality of contact terminals, which are projected to the second end section of said pack receptacle to be elastically deformed, and these contact terminals are pressed onto said second connector when said pack device is contained in said pack receptacle.

8. The apparatus according to claim 7, wherein said pack device is inserted to said pack receptacle in an inclined position where said first end portion is used as a head, and a contact portion between the contact terminals of said first connector and said second connector is used as a fulcrum, and said second end portion is rotated to the opening portion to be contained in said pack receptacle.

9. The apparatus according to claim 8, wherein said pack receptacle has a wall facing to said opening portion, and a guide wall continuous to an edge portion of said opening portion, and said guide wall is projected to the second end section rather than the contact terminals of said first connector at the position corresponding to the first end section, and the first end portion of said pack device is inserted between said wall and the guide wall.

10. The apparatus according to claim 9, wherein said pack device has a peripheral surface facing to said guide wall when said pack device is inserted to said pack receptacle in a correct position, and the peripheral surface has a concave portion, and said guide wall has a convex portion, which is inserted to said concave portion.

11. A portable apparatus comprising:

a housing having an opening portion;

a pack receptacle formed in said housing, said pack receptacle having a first end section on which a first connector is provided, and a second end section facing to the first end section, so as to be continuous to said opening portion; and a pack device detachably contained in said pack receptacle through said opening portion, and said pack device has a first end portion and a second end portion positioned to be opposite to said first end portion, and said first end portion has a second connector contacting said first connector;

wherein said pack device has a convex portion on said second end portion, said pack receptacle has lock means for maintaining said pack device at said pack receptacle on said second end section, said lock means has a slider movable between a lock position and a lock releasing position and maintained at said lock position through spring means, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position.

12. The apparatus according to claim 11, further comprising:

a detachable cover for covering the opening portion of said pack receptacle, and the cover formed to be continuous to the bottom wall of said housing.

13. The apparatus according to claim 12, wherein said housing has a lock lever, which is manually operated between the lock position where said lock lever is hooked on said cover and the lock releasing position where said lock lever is detached from said cover.

14. The apparatus according to claim 11, wherein said first cam portion has a cam surface, which is inclined to a direction approaching the opening portion of said pack receptacle as advancing to said insertion port from said engaging portion.

15. The apparatus according to claim 14, wherein said first cam portion has an end portion facing to said insertion port, and said end portion has a concave portion on which said convex portion is detachably hooked.

16. A portable apparatus comprising:

a housing having a bottom wall;

a pack receptacle formed in said housing, said pack receptacle having an opening portion formed on said bottom wall, a first end section having a first connector, and a second end section facing to the first end section, and said first connector being continuous to said opening portion; and a pack device contained in said pack receptacle to be detachable through said opening portion, said pack device having a first end portion, a second end portion positioned to be opposite to the first end portion, and said first end portion having a second connector contacting said first connector, wherein said pack device has a convex portion on said second end portion, said pack receptacle has lock means for maintaining said pack device at said pack receptacle on said second end section, said lock means has a slider movable between a lock position and a lock releasing position and maintained at said lock position, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position, and said pack receptacle and said pack device have engaging means for engaging said pack receptacle and said pack device with each other when said pack device is contained in said pack receptacle in a correct position.

17. A portable apparatus comprising:

a housing having an opening portion;

a pack receptacle formed in said housing, said pack receptacle having a first end section on which a first connector is provided, and a second end section facing to the first end section, so as to be continuous to said opening portion; and a pack device detachably contained in said pack receptacle through said opening portion, and said pack device has a first end portion and a second end portion positioned to be opposite to said first end portion, and said first end portion has a second connector contacting said first connector;

wherein said pack device has a convex portion on said second end portion, said pack receptacle has lock means for maintaining said pack device at said pack receptacle on said second end section, said lock means has a slider movable between a lock position and a lock releasing position and maintained at said lock position, said slider has an insertion port, an engaging portion, a first cam portion, and a second cam portion wherein said insertion port is formed such that the convex portion of said pack device is detachably inserted therethrough to be continuous to said opening portion, said engaging portion is formed to be engaged with said convex portion when said slider is moved to said lock position, said first cam portion connects the engaging portion to the insertion port, and slidably comes in contact with the convex portion when said slider is moved to the lock releasing position from the lock position, thereby pressing said convex portion to said insertion port, and said second cam portion is formed at a portion continuous to said insertion port, and said second cam portion slidably comes in contact with said convex portion when said pack device is inserted to said pack receptacle, thereby moving said slider to the lock releasing position from the lock position, and said pack receptacle and said pack device have engaging means for engaging said pack receptacle and said pack device with each other when said pack device is contained in said pack receptacle in a correct position.

* * * * *